(12) United States Patent
Tanaka et al.

(10) Patent No.: US 9,105,753 B2
(45) Date of Patent: Aug. 11, 2015

(54) SEMICONDUCTOR PHYSICAL QUANTITY SENSOR AND METHOD FOR MANUFACTURING THE SAME

(71) Applicant: DENSO CORPORATION, Kariya, Aichi-pref (JP)

(72) Inventors: Masaya Tanaka, Gifu (JP); Hisanori Yokura, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/957,738

(22) Filed: Aug. 2, 2013

(65) Prior Publication Data

US 2014/0042497 A1    Feb. 13, 2014

(30) Foreign Application Priority Data

Aug. 10, 2012 (JP) ................................. 2012-178244
Mar. 26, 2013 (JP) ................................. 2013-064488

(51) Int. Cl.

| | | |
|---|---|---|
| *H01L 29/82* | (2006.01) | |
| *H01L 29/76* | (2006.01) | |
| *H01L 21/00* | (2006.01) | |
| *G01L 9/06* | (2006.01) | |
| *H01L 29/84* | (2006.01) | |
| *G01L 9/00* | (2006.01) | |
| *H01L 29/8605* | (2006.01) | |
| *H01L 27/06* | (2006.01) | |

(52) U.S. Cl.
CPC .............. *H01L 29/84* (2013.01); *G01L 9/0042* (2013.01); *G01L 9/06* (2013.01); *H01L 29/8605* (2013.01); *H01L 27/0611* (2013.01)

(58) Field of Classification Search
CPC ..... H01L 29/82; H01L 29/84; H01L 29/8605; G01L 9/0042; G01L 9/06
USPC ................... 257/415, 417–419, 48, E29.166, 257/E29.197; 361/56, 91; 438/479
See application file for complete search history.

(56) References Cited

U.S. PATENT DOCUMENTS

| | | | | |
|---|---|---|---|---|
| 5,159,518 A | * | 10/1992 | Roy | ................................ 361/56 |
| 5,932,921 A | * | 8/1999 | Sakai et al. | ................... 257/419 |
| 2003/0038328 A1 | | 2/2003 | Ishio | |

FOREIGN PATENT DOCUMENTS

| | | |
|---|---|---|
| JP | 6-244413 A | 9/1994 |
| JP | 10-116995 A | 5/1998 |

* cited by examiner

*Primary Examiner* — Kimberly Rizkallah
*Assistant Examiner* — Brian Turner
(74) *Attorney, Agent, or Firm* — Posz Law Group, PLC

(57) ABSTRACT

A semiconductor physical quantity sensor includes (i) a semiconductor substrate having a first conductive type, (ii) a diaphragm portion disposed in the semiconductor substrate, (iii) a sensing portion disposed in the diaphragm portion, (iv) a well layer having a second conductive type, and (v) a back flow prevention element. The well layer is disposed in a surface portion of the semiconductor substrate, and corresponds to the diaphragm portion. The back flow prevention element is provided by a MOSFET, a JFET, a MESFET, or a HEMT. The back flow prevention element includes two second conductive diffused portions and a gate electrode. The back flow prevention element is arranged on a first electrical wiring, which provides a passage for applying a predetermined voltage to the well layer from an external circuit. The back flow prevention element turns on based on a voltage applied to the gate electrode.

14 Claims, 10 Drawing Sheets

SEMICONDUCTOR PHYSICAL QUANTITY SENSOR AND METHOD FOR MANUFACTURING THE SAME

CROSS REFERENCE TO RELATED APPLICATIONS

This application is based on Japanese Patent Application No. 2012-178244 filed on Aug. 10, 2012 and Japanese Patent Application No. 2013-64488 filed on Mar. 26, 2013, the disclosures of which are incorporated herein by reference.

TECHNICAL FIELD

The present disclosure relates to a semiconductor physical quantity sensor and a method for manufacturing the same. The semiconductor physical quantity sensor includes multiple diffused resistors having a piezo resistance effect arranged at a diaphragm.

BACKGROUND

Conventionally, a semiconductor physical quantity sensor is known. The semiconductor physical quantity sensor is provided with multiple diffused resistors having a piezo resistance effect. The semiconductor physical quantity sensor detects an applied physical quantity based on a resistance of the diffused resistors. This kind of the semiconductor physical quantity sensor is, for example, a pressure sensor. For example, the pressure sensor has a thin portion, which is called a diaphragm. The thin portion is partially formed on a silicon substrate as a semiconductor substrate. Based on phenomena that a resistance of the diffused resistors formed on the diaphragm is changed according to pressure, the pressure sensor detects an applied pressure. Specifically, the diffused resistors provide a bridge by connecting to each other via a wiring pattern. The equilibrium state of the bridge is disturbed according to the applied pressure, so that a voltage signal is outputted according to the pressure.

In the pressure sensor having such a configuration, in order to obtain a configuration to precisely detect the pressure, an anisotropic etching is performed by an electrochemical etch-stop technique as an etching process to form the diaphragm. In the electrochemical etch-stop technique, a thickness of the diaphragm is easily controlled. When the anisotropic etching is performed with an etching solution such as a tetramethylammonium hydroxide (TMAH) solution, a predetermined voltage Vcc is applied to a portion corresponding to the diaphragm. As the etching process proceeds, when a depletion layer provided by voltage application is exposed to the etching solution, an oxide film is formed on a surface of the semiconductor substrate by anode oxidation, and therefore the etching process is stopped. Using these phenomena, the diaphragm with a predetermined thickness is formed.

Specifically, an electrical wiring is disposed to be connected in parallel to multiple chips on a wafer, and an oxide film covers a portion of a back surface of the semiconductor substrate except for a diaphragm-to-be-planned portion. Then, in the electrochemical etch-stop process, by applying the predetermined voltage Vcc to the diaphragm through the electrical wiring, the back surface of the semiconductor substrate corresponding to the diaphragm-to-be-planned portion is etched, and therefore the diaphragm is formed.

After the diaphragm is formed by such a manner, the wafer is diced along a scribe line and divided into multiple chips. In a case where the etching remainder of the electrical wiring adheres to an edge of the chip, the electrical wiring and a p-type silicon substrate may short-circuit in an operation of a semiconductor pressure sensor. To prevent a short-circuit, as shown in FIG. 10, a diode J1 is formed to provide a forward bias in voltage application in the electrochemical etch-stop process and to provide a reverse bias in the operation of the pressure sensor. Specifically, the semiconductor substrate which is formed with an n-type epitaxial layer J3 on a surface of a p-type silicon substrate J2 is used, and the diode J1 is formed. The diode J1 includes a PN junction diode on the surface portion of the n-type epitaxial layer J3. The PN junction diode includes an $n^+$-type layer J5 and a p-type portion including a $p^+$-type layer J4. In the electrochemical etch-stop process, the predetermined voltage Vcc, which is applied from a pad J6, is applied to an $n^+$-type layer J10 of a diaphragm J9 through an electrical wiring J7, the diode J1, and a electrical wiring J8.

However, as shown in FIG. 10, a parasitic transistor is provided among a p-type portion of the diode J1, the n-type epitaxial layer J3, and the p-type silicon substrate J2. Therefore, in the electrochemical etch-stop process, the parasitic transistor may turn on, and current leaks from an electrical wiring to the p-type silicon substrate J2. As a result, since the current leaks to the diaphragm through the p-type silicon substrate J2, the electrochemical etch-stop process stops unexpectedly and therefore some defects may occur to result in a deficient etching treatment. Therefore, to prevent influence of the parasitic transistor, as shown in FIG. 11, conventionally an $n^+$-type buried diffused layer J11 is added as a carrier stopper between an n layer and a p-type silicon substrate, which are disposed under a diode (referring to JP-A-H10-135484 corresponding to U.S. Pat. No. 5,932,921-A).

SUMMARY

It is an object of the present disclosure to provide a semiconductor physical quantity sensor, which has a simplified configuration and is not affected by a parasitic transistor, and a manufacturing method of the same. Furthermore, an object of the present disclosure is to provide a semiconductor physical quantity sensor and a manufacturing method of the same, which removes an influence of the parasitic transistor more surely.

The semiconductor physical quantity sensor includes (i) a semiconductor substrate having a first conductive type, (ii) a diaphragm portion disposed in the semiconductor substrate, (iii) a sensing portion disposed in the diaphragm portion, (iv) a well layer having a second conductive type disposed in a surface portion of the semiconductor substrate, and (v) a back flow prevention element. The well layer corresponds to the diaphragm portion. The back flow prevention element is provided by a MOSFET, a JFET, a MESFET, or a HEMT, and includes two second conductive diffused portions and a gate electrode. The two second conductive diffused portions are spaced apart from each other and disposed on an outside of the well layer in the semiconductor substrate. The gate electrode is disposed on a channel region through a gate insulating film. The channel region is arranged between the two second conductive diffused portions. The back flow prevention element is arranged on a first electrical wiring, which provides a passage for applying a predetermined voltage to the well layer from an external circuit. The back flow prevention element turns on, based on a voltage applied to the gate electrode.

According to the above disclosure, it is possible that a semiconductor physical quantity sensor having simplified structure and not being affected by the parasitic transistor is provided.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Inventors of the present disclosure have found the following with regard to a semiconductor physical quantity sensor. For example, it is preferable when the present disclosure is applied to a pressure sensor.

Figure 11:
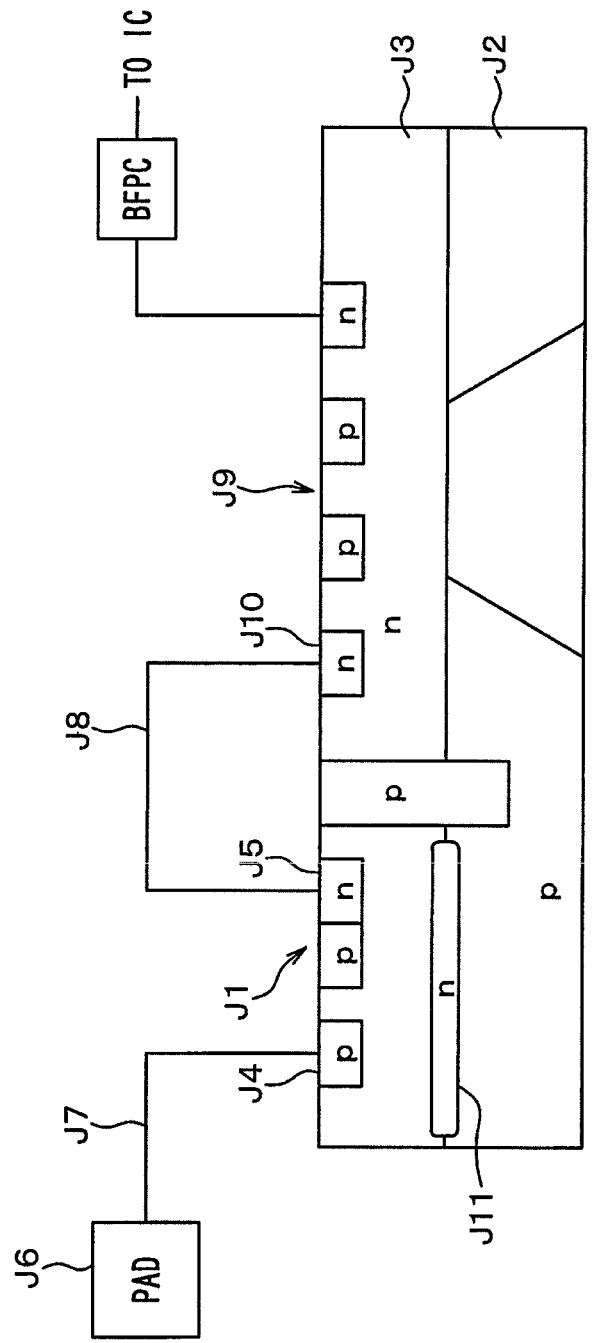
FIG. 11 is a sectional view of a pressure sensor having a parasitic transistor prevention structure, according to a prior art.

Even when an n+-type buried diffused layer 311 is disposed as described in FIG. 11, a parasitic transistor is not substantially removed. In a case where the n+-type buried diffused layer J11 is added as a carrier stopper, an extra manufacturing process is needed to form the n+-type buried diffused layer J11 only for avoidance of the parasitic transistor. Especially, in an effort to produce a sophisticated and downsized pressure sensor, introduction of integration by a MOS circuit, for example a CMOS, is desired with regard to an integrated circuit configuring a signal process circuit of the pressure sensor. However, since the MOS circuit such as the CMOS is mainly a surface device, there is no room to form the n+-type buried diffused layer J11, which provides avoidance of the parasitic transistor.

Embodiments of the present disclosure will be described below based on the drawings. It should be noted that parts identical or similar in each of the following embodiments are denoted by the same reference symbols.

First Embodiment

A first embodiment of the present disclosure will be described with reference to FIG. 1 to FIG. 3. In the first embodiment, a pressure sensor will be described as an example of a semiconductor physical quantity sensor. The pressure sensor generates a sensor output signal according to an applied pressure. The pressure sensor includes a diaphragm which is formed at a portion corresponding to a sensing portion by an electrochemical etch-stop process.

An electrochemical etch-stop technique may correspond to an example of an electrochemical etching technique.

Figure 1:
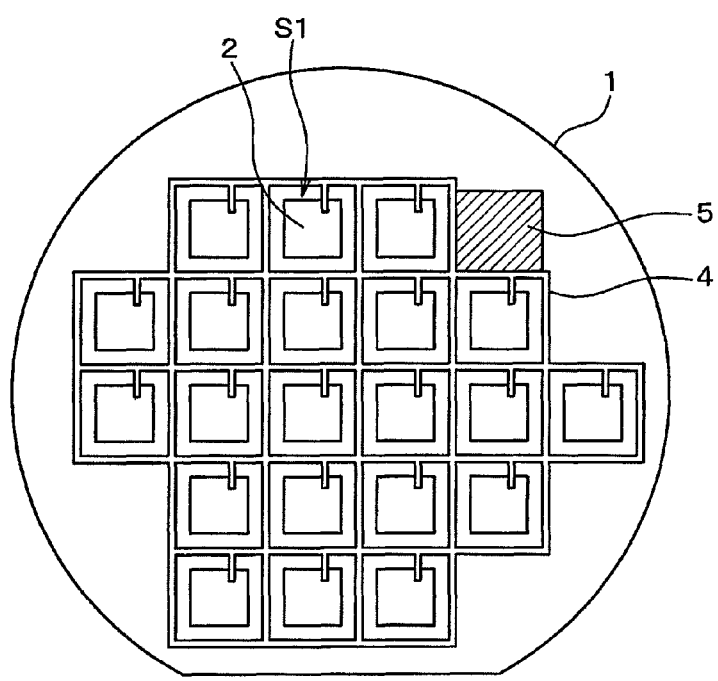
FIG. 1 is a diagram illustrating a layout of a semiconductor substrate used in a manufacturing of a pressure sensor according to a first embodiment of the present disclosure.

As shown in FIG. 1, multiple pressure sensors S1, each of which corresponds to a chip, are formed on a disc-shaped semiconductor substrate 1. A diaphragm 2 is formed by the electrochemical etch-stop process. Then, the semiconductor substrate 1 is divided into multiple chips in a dicing process, and the multiple pressure sensors S1 are formed. For example, the semiconductor substrate 1 is made from semiconductor material such as silicon. In the electrochemical etch-stop process, the semiconductor material is soaked into an etching solution to etch the semiconductor material, and a predetermined voltage Vcc is applied to the diaphragm 2.

The diaphragm 2 corresponds to an example of a diaphragm portion according to the present disclosure.

Figure 2:
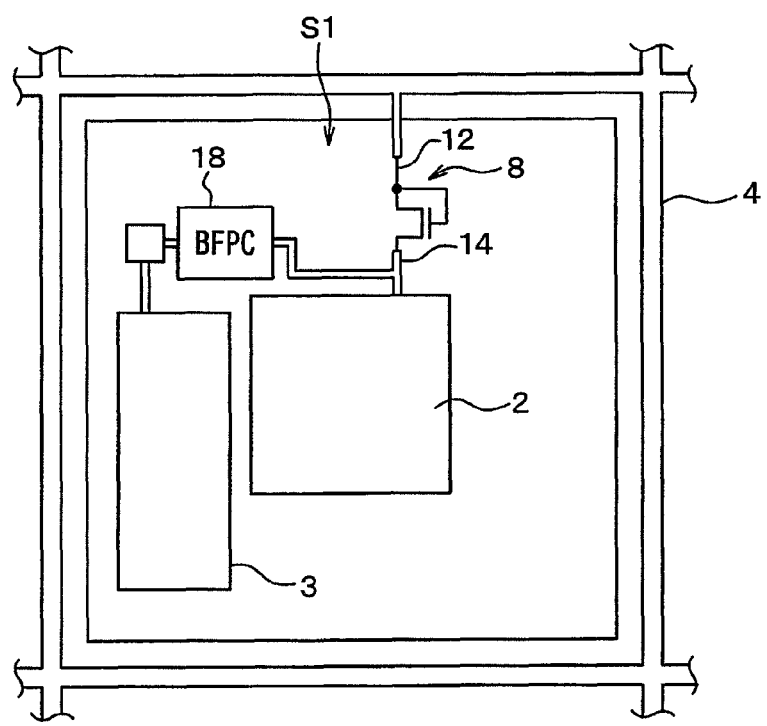
FIG. 2 is an enlarged diagram corresponding to one chip of the pressure sensor in FIG. 1.

As shown in FIG. 2, a pressure sensor S1 includes the diaphragm 2 at a predetermined portion and an integrated circuit 3. The integrated circuit 3 has a signal processing circuit or the like close to the diaphragm 2. In the present embodiment, the diaphragm 2 is disposed at the center of the pressure sensor S1. The integrated circuit 3 corresponds to a circuit portion. Before the semiconductor substrate 1 is divided into the multiple chips, as shown in FIG. 1 and FIG. 2, the pressure sensors S1 is surrounded by a conductive pattern 4 arranged along a scribe line. The conductive pattern 4 is connected with a pad 5. The pad 5 is arranged adjacent to a forming portion of the pressure sensor S1. Therefore, in the electrochemical etch-stop process, the predetermined voltage Vcc is applied to the conductive pattern 4 from the pad 5.

Figure 3:
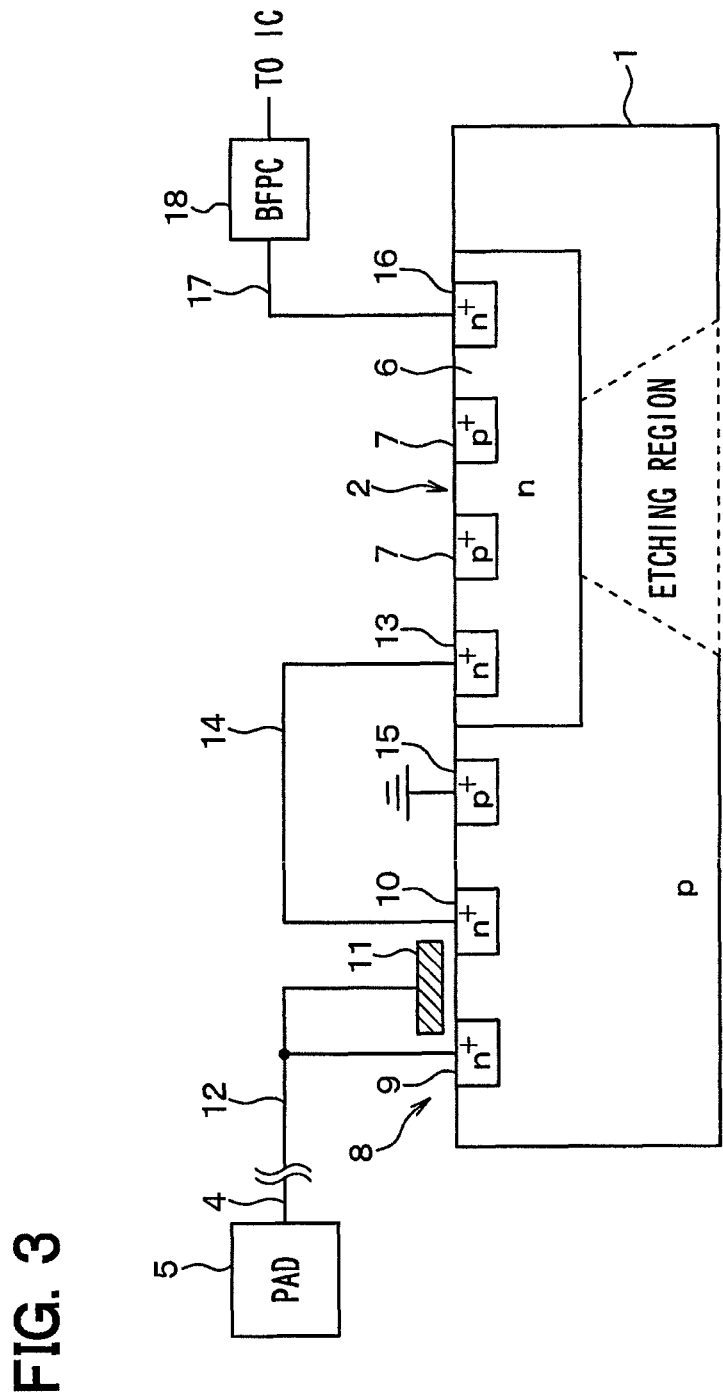
FIG. 3 is a cross sectional view of the pressure sensor in an electrochemical etch-stop technique.

As shown in FIG. 3, the diaphragm 2 is made to be thin by removing an etching region of the semiconductor substrate 1. The etching region is illustrated by a broken line in FIG. 3. When the pressure sensor S1 receives pressure at the diaphragm 2, the pressure sensor S1 outputs a sensor output signal according to the pressure. The pressure is detected based on the sensor output signal. In order to precisely detect the pressure, the output signal of the sensing portion against a pressure variation should be increased. Therefore, to realize it, the diaphragm 2 is formed at a portion of the semiconductor substrate 1 corresponding to the sensing portion.

Specifically, as shown in FIG. 3, an n-type well layer 6 is formed at a diaphragm-to-be-formed portion on the semiconductor substrate 1, which is made from a p-type silicon substrate or the like. On a surface portion of the n-type well layer 6, a p+-type diffused resistor 7 having a piezo resistance effect is formed. The p+-type diffused resistor 7 configures a sensing portion. For example, the p+-type diffused resistor 7 provides a Wheatstone bridge by connecting to each other via an unshown wiring pattern. In an operation of the pressure sensor S1, a drive voltage is applied to a first connection point in the p+-type diffused resistor 7, which provides a part of the Wheatstone bridge. A second connection point corresponds to a diagonal of the first connection point and is connected to a GND. A midpoint potential of the other connection points is outputted as a differential output. According to the configuration, when the pressure is applied to the diaphragm 2, an equilibrium state is disturbed by the applied pressure, so that a voltage signal is outputted according to the pressure.

The diaphragm 2 is formed at a lower part of the n-type well layer 6 by the electrochemical etch-stop process. In the electrochemical etch-stop process, a back surface of the semiconductor substrate 1, which is illustrated as the etching region in FIG. 3, is removed. Specifically, after each element for configuring the sensing portion, the integrated circuit 3 or the like is formed on a surface of the semiconductor substrate 1, an oxide film or the like masks a portion except for the diaphragm-to-be-planned portion on the back surface of the semiconductor substrate 1. Then, the semiconductor substrate 1 is soaked into an etching solution including a solution such as TMAH. A counter electrode to be a GND potential is placed in the etching solution. The predetermined voltage Vcc is applied to the n-type well layer 6. As a result, a reverse voltage is applied between the n-type well layer 6 and the p-type semiconductor substrate 1. When the semiconductor substrate 1 is etched from the back surface of the semiconductor substrate 1 and when the depletion layer, which is provided at a PN junction formed between the n-type well layer 6 and the p-type semiconductor substrate 1, is exposed to the etching solution, anode oxidation occurs on the surface of the semiconductor substrate 1 and an oxide film is formed, so that the etching process is stopped. According to this manner, the diaphragm 2 having predetermined thickness is formed.

So that a predetermined reverse voltage is applied to the n-type well layer 6, as described above, the conductive pattern 4 is arranged around the pressure sensors S1, and the predetermined voltage Vcc is applied to the n-type well layer 6 through the conductive pattern 4 in the electrochemical etch-stop process.

However, when the semiconductor substrate 1 is divided into the multiple chips along the scribe line after the diaphragm 2 is formed, an etching remainder of the conductive pattern 4 may adhere to an edge of the chip. In this situation, in the operation of the pressure sensor S1, the electrical wiring of a substrate surface and the semiconductor substrate 1 may short-circuit, so that the pressure can not be detected precisely. Conventionally, to prevent this situation, a diode is formed between the diaphragm 2 and the conductive pattern 4. However, providing the diode may cause the parasitic transistor. Therefore, in addition to the providing of the diode, an n$^+$-type buried diffused layer has to be disposed under the diode.

Figure 10:
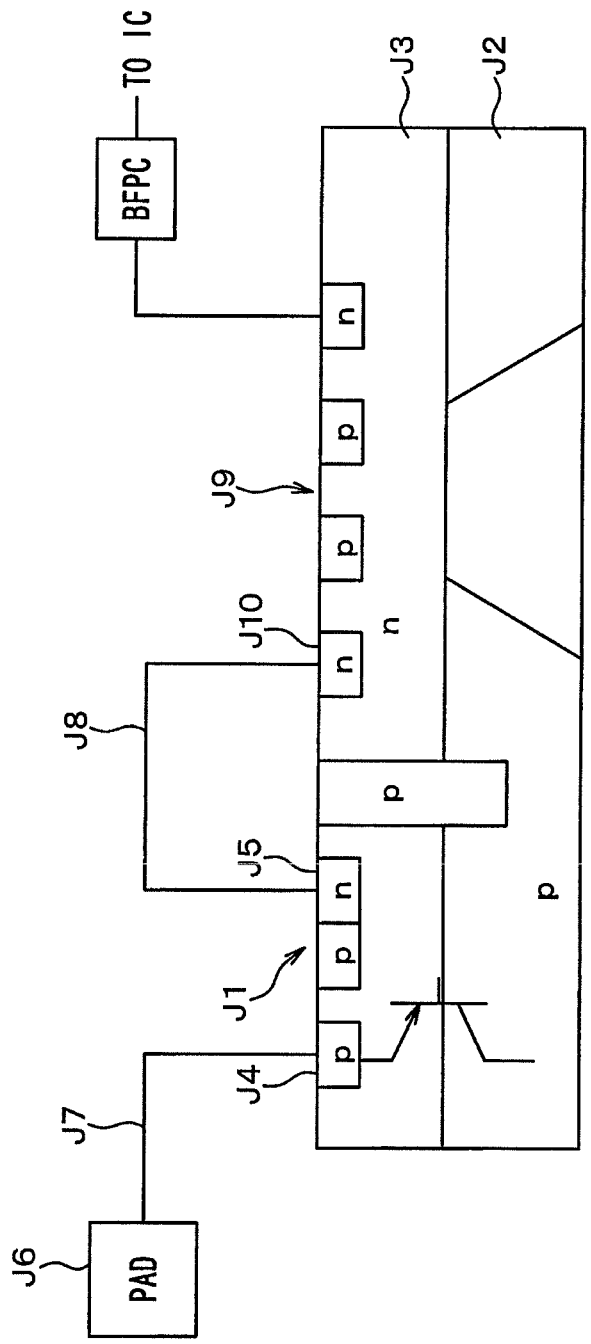
FIG. 10 is a cross sectional view of a pressure sensor illustrating a parasitic transistor that is formed in the electrochemical etch-stop technique, according to a prior art.

In the present embodiment, a MOSFET 8 is formed instead of the conventional diode J1 (referring to FIG. 10 and FIG. 11). The MOSFET 8 causes current to flow in a forward direction in the electrochemical etch-stop process and prevents current from flowing in a reverse direction. The MOSFET 8 functions as a backward flow prevention element in the operation of the pressure sensor S1. In the present embodiment, an n-channel MOSFET is provided as the MOSFET 8, which functions as the backward flow prevention element by providing a MOS switching structure.

Specifically, in a different portion (i.e., the periphery of the diaphragm 2) of the semiconductor substrate 1 from the diaphragm 2, n$^+$-type diffused portions 9, 10, which space apart from each other, are formed on a surface portion of the semiconductor substrate 1. A channel forming portion is provided between the n$^+$-type diffused portions 9, 10. A gate electrode 11 is formed on the surface of the channel forming portion through an unshown gate insulating film. According to the configuration, the MOSFET 8 is formed. The n$^+$-type diffused portion 9 and the gate electrode 11 of the MOSFET 8 are electrically connected through an electrical wiring 12, which functions as a leading wire. Furthermore, as shown in FIG. 1 and FIG. 2, the electrical wiring 12 is connected with the conductive pattern 4, which surrounds the pressure sensor S1. In the n-type well layer 6, on which the diaphragm 2 is formed, an n$^+$-type diffused portion 13 is formed. The n$^+$-type diffused portion 10 of the MOSFET 8 and the n$^+$-type diffused portion 13 are electrically connected through an electrical wiring 14. According to the configuration, it is possible that the predetermined voltage Vcc is applied to the n-type well layer 6 through the electrical wirings 12, 14, the MOSFET 8 and the n$^+$-type diffused portion 13.

Therefore, in the electrochemical etch-stop process, the predetermined voltage Vcc is applied to the n-type well layer 6, so that the back surface of the semiconductor substrate 1 is etched partially.

In the operation of the pressure sensor S1, since voltage is applied from the integrated circuit 3, a current with a reverse direction may flow to the integrated circuit 3 when the predetermined voltage Vcc is applied to the n-type well layer 6 in the electrochemical etch-stop process. To prevent the situation, a circuit 18 is disposed along an electrical wiring 17 to control current flow to the integrated circuit 3. The electrical wiring 17 connects the integrated circuit 3 and an n$^+$-type diffused portion 16, which is formed on the surface portion of the n-type well layer 6. The circuit 18 refers to a back flow prevention circuit 18. By disposing the back flow prevention circuit 18, the integrated circuit 3 is protected from damage due to an excess current in the electrochemical etch-stop process. The back flow prevention circuit 18 may include a diode, a MOSFET or a resistor, and refers to a circuit having a function for controlling a current supply.

Furthermore, in the different portion (i.e., the periphery of the diaphragm 2) of the semiconductor substrate 1 from the diaphragm 2, a p$^+$-type diffused portion 15 is formed on the surface portion of the semiconductor substrate 1. An electric potential of the semiconductor substrate 1 is kept at the GND potential through the p$^+$-type diffused portion 15.

As described above, in the present embodiment, the MOSFET 8 as the back flow prevention element is formed between the diaphragm 2 and the conductive pattern 4, specifically, formed between the electrical wirings 12, 14. The electrical wirings 12, 14 provide a passage for applying the predetermined voltage Vcc to the n-type well layer 6 from an external circuit. According to the configuration, in the electrochemical etch-stop process, when the predetermined voltage Vcc is applied to the pad 5, the predetermined voltage Vcc is applied to the gate electrode 11, so that the MOSFET 8 turns on and the predetermined voltage Vcc is applied to the n-type well layer 6 through the electrical wiring 14 from the MOSFET 8. As a result, the reverse voltage is applied between the n-type well layer 6 and the semiconductor substrate 1, so that the electrochemical etch-stop process can be performed properly.

In performing the electrochemical etch-stop process, since the predetermined voltage Vcc is applied to the n$^+$-type diffused portion 9 of the MOSFET 8, the parasitic transistor is not provided. Therefore, even when the n$^+$-type buried diffused layer is not formed, the parasitic transistor may not be provided, and it does not need to have an extra manufacturing process for forming the n$^+$-type buried diffused layer.

Furthermore, since the back flow prevention circuit 18 is disposed between the sensing portion and the integrated circuit 3, even when the predetermined voltage Vcc is applied to the n-type well layer 6 in the electrochemical etch-stop process, a current with a reverse direction will not flow to the integrated circuit 3.

After the electrochemical etch-stop process is completed, the semiconductor substrate 1, which is provided with the diaphragm 2, is diced along the scribe line. The multiple pressure sensors S1, each of which corresponds to the chip, are manufactured. In the operation of the pressure sensor S1, the etching remainder of wiring in the pressure sensor S1 may adhere to the edge of the chip, so that the electrical wiring 12 and the semiconductor substrate 1 may short-circuit. However, if a short-circuit occurs, since potential voltage applied to the gate electrode 11 is zero and the MOSFET 8 turns off, it is possible to prevent the sensing portion from short-circuiting. Therefore, even when the electrical wiring 12 and the semiconductor substrate 1 short-circuit, the sensing portion and the integrated circuit 3 are not affected, so that the pressure can be detected precisely.

Furthermore, a signal which is outputted from the sensing portion is treated by a signal process circuit in the integrated circuit 3, and the processed result is considered as a sensor output. A MOS circuit such as a CMOS may form the signal process circuit. In the configuration, since the MOS circuit such as the CMOS is mainly a surface device, there is no room to form the $n^+$-type buried diffused layer in the signal process circuit. Therefore, in a case where the signal process circuit is configured by the MOS circuit such as the CMOS, it is advantage that the parasitic transistor is not provided without the $n^+$-buried diffused layer as described in the present embodiment.

Second Embodiment

A second embodiment of the present disclosure will be described. Comparing with the first embodiment, the second embodiment includes an input protection circuit, and the other part is similar to the first embodiment. Therefore, only a different part from the first embodiment will be described.

Figure 4:
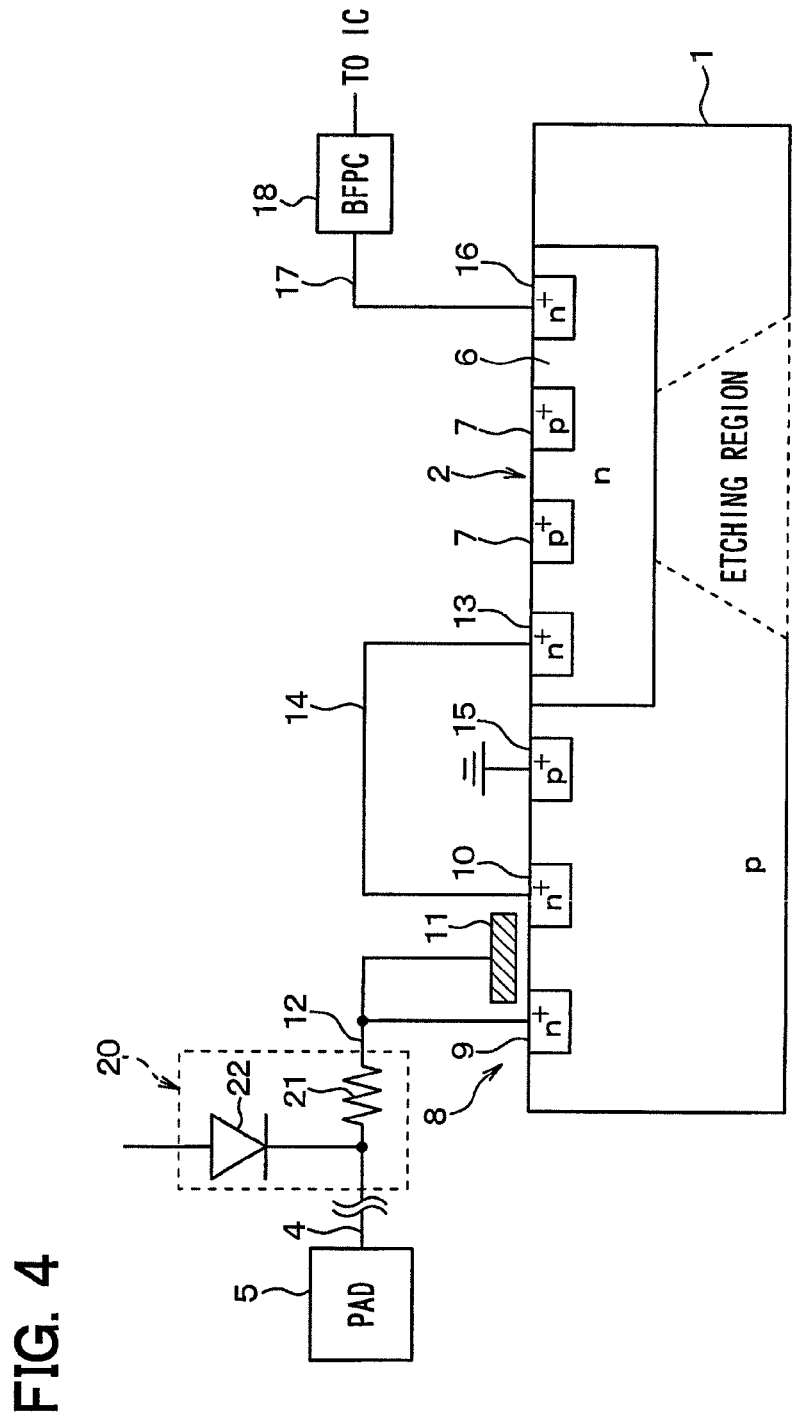
FIG. 4 is a cross sectional view of a pressure sensor according to a second embodiment of the present disclosure.

As shown in FIG. 4, in the second embodiment, an input protection circuit 20 is formed among the pad 5, the $n^+$-type diffused portion 9, and the gate electrode 11. In other words, the input protection circuit 20 is formed along the electrical wiring 12. The input protection circuit 20 includes a protection resistor 21 and a zener diode 22. The protection resistor 21 is connected with the electrical wiring 12 in series, and the zener diode 22 is connected with the electrical wiring 12 in parallel. As described above, by including the input protection circuit 20, when large voltage is applied to the pad 5 by a surge or the like, the MOSFET 8 and each part of the pressure sensor S1 can be protected. In other words, it is possible that the protection resistor 21 prevents a high current from flowing into the gate electrode 11, and that the zener diode 22 controls the voltage, which is applied to the gate electrode 11 and the $n^+$-type diffused portion 9, to be within a zener breakdown voltage.

Figure 5:
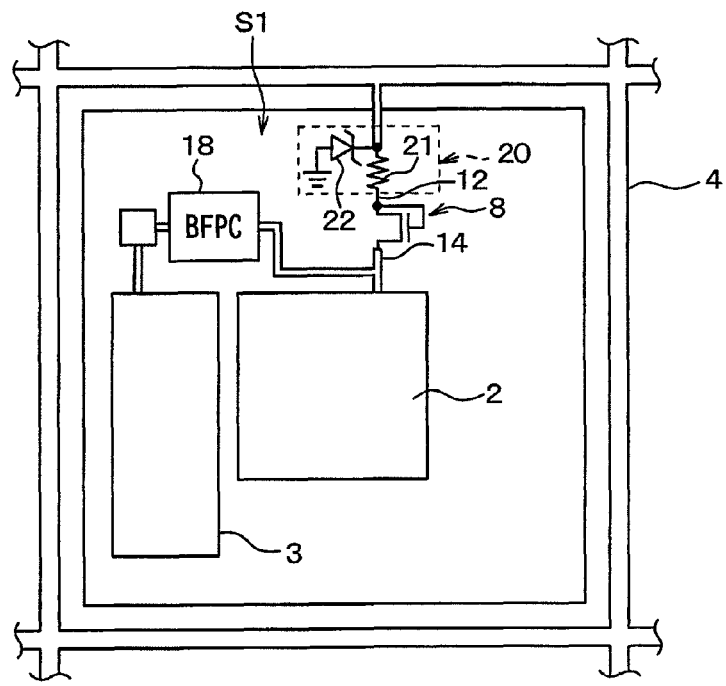
FIG. 5 is an enlarged diagram corresponding to one chip of the pressure sensor in FIG. 4.

For example, the input protection circuit 20 having such a configuration may have a layout shown in FIG. 5. The protection resistor 21 may be disposed in the middle of the electrical wiring 12, which is extended from the conductive pattern 4 to an inside of the chip, and the zener diode 22 may be placed between the conductive pattern 4 and the protection resistor 21 in the electrical wiring 12.

Other Embodiments (1) In the first and second embodiments, the n-channel MOSFET is exemplified as the MOSFET 8 configuring the back flow prevention element. The MOSFET 8 may be a p-channel MOSFET. That is, in each of the above embodiments, the pressure sensor S1 is formed by assigning a first conductive type as a p-type and a second conductive type as an n-type. The second conductive channel, which provides a MOSFET with the back flow prevention element, is exemplified. The first conductive type may be the n-channel MOSFET and the second conductive type may be the p-channel MOSFET.

Figure 6A:
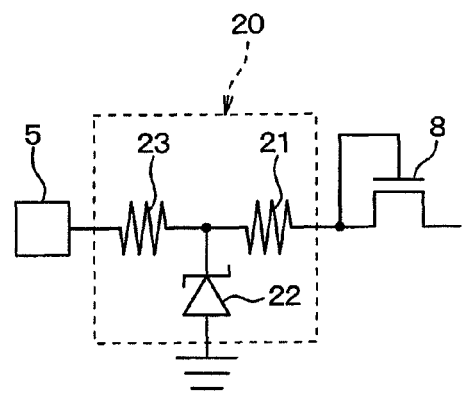
FIG. 6A is a circuit diagram illustrating an example of an input protection circuit described in another embodiment.
Figure 6B:
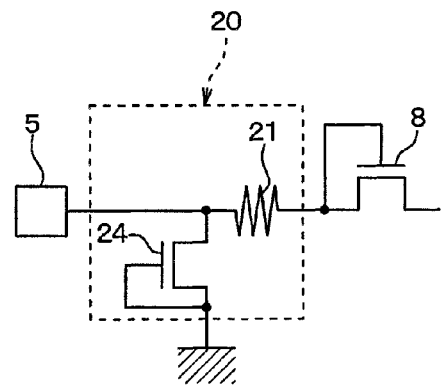
FIG. 6B is a circuit diagram illustrating an example of an input protection circuit described in the another embodiment.

(2) Furthermore, in the second embodiment, a configuration with the protection resistor 21 and the zener diode 22 is exemplified as the input protection circuit 20. It is not limited to this configuration. For example, as shown in FIG. 6A, it is also possible that a restriction resistor 23 is disposed at a position which is closer to the pad 5 than a connection point with the zener diode 22 along the electrical wiring 12. The position is an opposite side of the MOSFET 8 from the connection point. By forming the restriction resistor 23, a current flowing to the zener diode 22 may be controlled even when large voltage is applied. Furthermore, as shown in FIG. 6B, instead of the zener diode 22, a MOSFET 24 may be formed in parallel to the electrical wiring 12. According to the configuration, in a case where large voltage is applied, the MOSFET 24 turns on, and therefore an applied voltage to the gate electrode 11 and the $n^+$-type diffused portion 9 of the MOSFET 8 may be controlled. Furthermore, regarding the zener diode 22, when the multiple zener diodes 22 are disposed in parallel, zener breakdown easily occurs depending on the number of the zener diodes 22, so that protection function is more improved.

(3) Furthermore, in the above embodiments, the MOSFET 8 is exemplified as the back flow prevention element to suppress an influence of the parasitic transistor and prevent a back flow. Other kinds of back flow prevention elements, for example, a JFET, a MESFET or a HEMT may be used.

The JFET denotes a junction field effect transistor, the MESFET denotes a metal semiconductor field effect transistor, and the HEMI denotes a high electron mobility transistor.

(4) Furthermore, in the above embodiments, the gate electrode 11 is connected with the electrical wiring 12. A gate voltage for the gate electrode 11 may be applied through another pad different from the pad 5 in the electrochemical etch-stop process, so that the MOSFET 8 turns on.

(5) Furthermore, in the above embodiments, a layout of the electrical wiring 12 corresponding to the leading wire may be changed.

Figure 7:
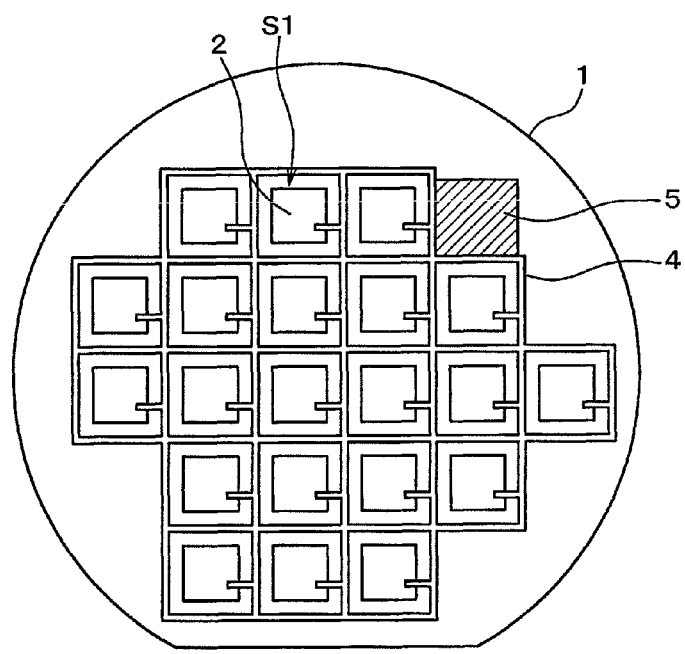
FIG. 7 is a diagram illustrating an example of a layout of a semiconductor substrate that is used in a manufacturing of a pressure sensor described in the another embodiment.

For example, in the first embodiment, on the disc-shaped semiconductor substrate 1, the pressure sensors S1 corresponding to the multiple chips are arranged along a first direction and a second direction which is perpendicular to the first direction. The electrical wiring 12 is arranged perpendicular to an orientation flat (referring to FIG. 1). In contrast, as shown in FIG. 7, a position of the electrical wiring 12 in the first embodiment may be rotated 90 degrees around the center of the chip, so that the electrical wiring 12 may be extended in a parallel direction to the orientation flat. In this configuration, in order to shorten a length of the electrical wiring 12, other parts included in the pressure sensor S1 may also be rotated 90 degrees around the center of the chip.

Figure 8:
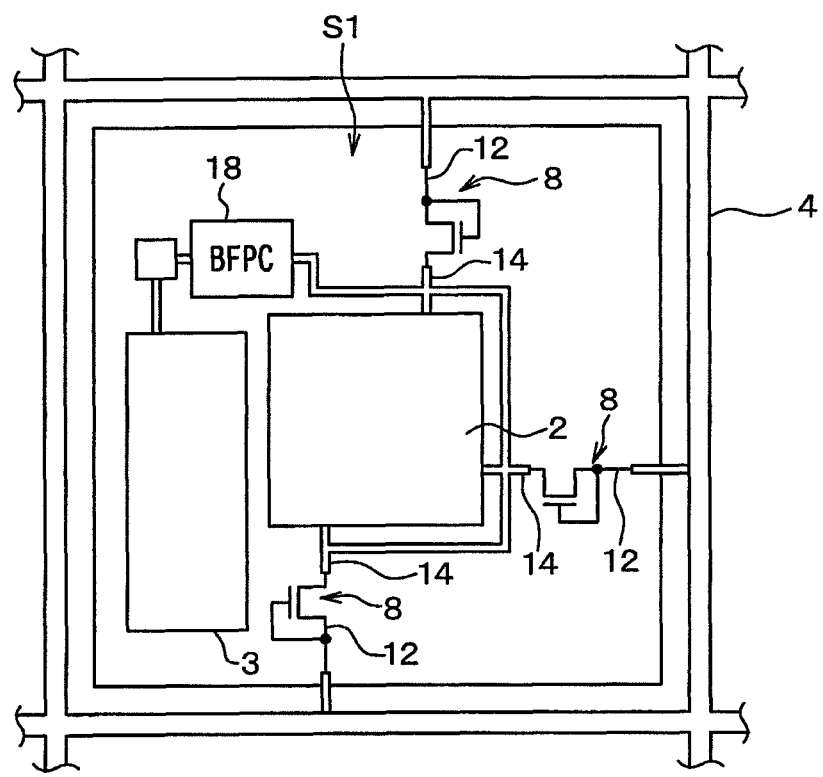
FIG. 8 is an enlarged diagram corresponding to one chip of the pressure sensor described in the another embodiment.

Furthermore, the number of the electrical wiring 12 and the number of the MOSFET 8 is not limited to one. In other words, the multiple electrical wirings 12 and the multiple MOSFETs 8 may be formed on the pressure sensor S1. For example, as shown in FIG. 8, the multiple electrical wirings 12 and the multiple MOSFETs 8 may be arranged around the diaphragm 2 at a predetermined intervals (the three electrical wirings 12 and the three MOSFETs 8 are used in FIG. 8). According to this configuration, by increasing the number of the electrical wiring 12 and/or the MOSFET 8, it is possible to reduce a potential drop, and thickness dispersion of the diaphragm 2 may be improved.

Figure 9:
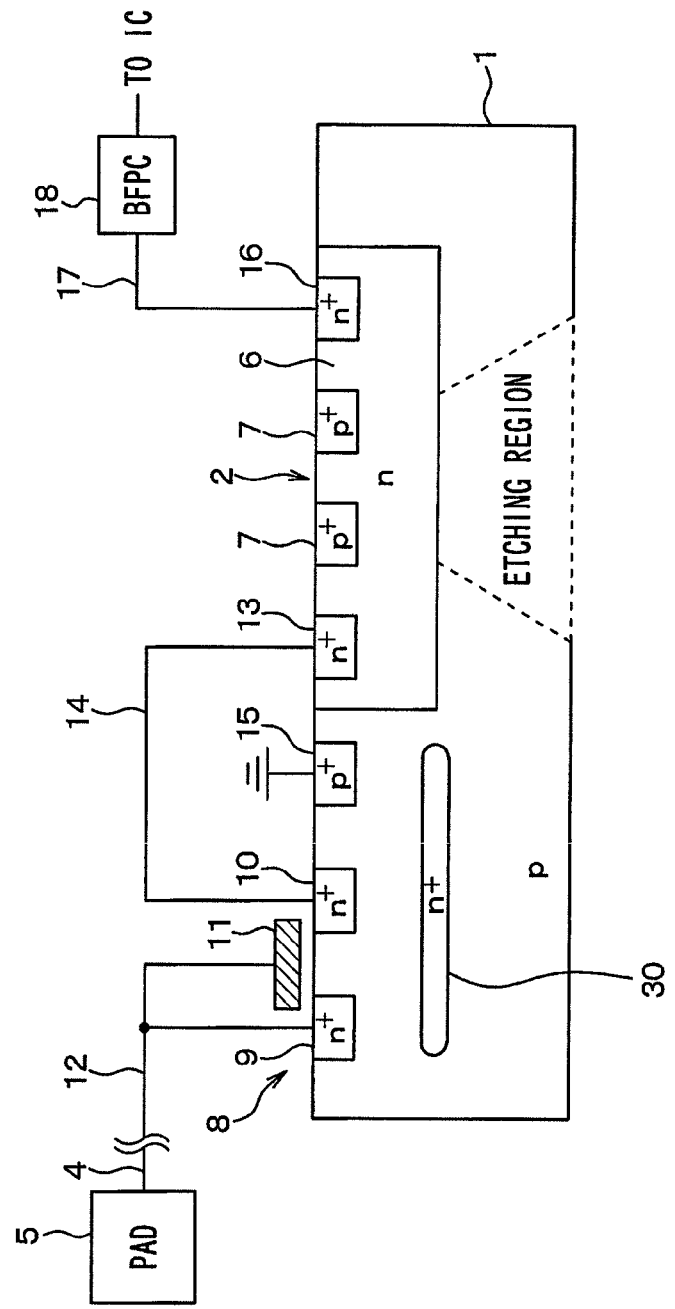
FIG. 9 is a cross sectional view of the pressure sensor described in the electrochemical etch-stop technique in the another embodiment.

(6) Furthermore, in the above embodiments, in order to eliminate the influence of the parasitic transistor more surely, as shown in FIG. 9, an $n^+$-type buried diffused layer 30 may be provided. According to the configuration, in a case where the $n^+$-type buried diffused layer 30 is provided additionally, it is possible that a formation of the parasitic transistor is more surely prevented, and that the influence of the parasitic transistor is eliminated more surely.

(7) Furthermore, in the above embodiment, the pressure sensor S1 is exemplified as a semiconductor physical quantity sensor having the diaphragm 2, the present disclosure may be applied to an acceleration sensor or the like.

Summarizing the above embodiment, The semiconductor physical quantity sensor includes (i) a semiconductor substrate having a first conductive type, (ii) a diaphragm portion disposed in the semiconductor substrate, (iii) a sensing portion disposed in the diaphragm portion, (iv) a well layer having a second conductive type disposed in a surface portion of the semiconductor substrate, and (v) a back flow prevention element. The well layer corresponds to the diaphragm portion. The back flow prevention element is provided by a MOSFET, a JFET, a MESFET, or a HEMI, and includes two second conductive diffused portions and a gate electrode. The two second conductive diffused portions are spaced apart from each other and disposed on an outside of the well layer in the semiconductor substrate. The gate electrode is disposed on a channel region through a gate insulating film. The channel region is arranged between the two second conductive diffused portions. The back flow prevention element is arranged on a first electrical wiring, which provides a passage for applying a predetermined voltage to the well layer from an external circuit. The back flow prevention element turns on, based on a voltage applied to the gate electrode.

As described above, the back flow prevention element such as the MOSFET is disposed along the electrical wiring for applying the predetermined voltage to the well layer from an external circuit. According to the configuration, in the electrochemical etching, when the predetermined voltage is applied from the external circuit, the predetermined voltage is applied to the gate electrode of the MOSFET, and therefore the MOSFET turns on. The predetermined voltage is applied to the well layer through the MOSFET and the electrical wiring 14. As a result, it is possible that a reverse voltage is applied between the well layer and the semiconductor substrate, and that the electrochemical etch-stop process is conducted properly.

When such the electrochemical etch-stop process is performed, the predetermined voltage is applied to the second conductive diffused portion 9, which is provided in the MOSFET, and the parasitic transistor is not provided. Therefore, even when the MOSFET has a simple configuration, it is possible that the parasitic transistor is prevented from being provided. Especially, the parasitic transistor may not be provided even when a buried diffused layer is not disposed. For example, it is possible that the above feature is obtained by a more simplified configuration in a case where the buried diffused layer is omitted. In contrast, in the above configuration, in a case where the buried diffused layer is disposed additionally, it is possible that a formation of the parasitic transistor is more surely prevented and that the influence of the parasitic transistor is prevented more surely.

Especially, in a case where the circuit portion 3 is a MOS circuit, since the MOS circuit is mainly surface device, there is no room to form the buried diffused layer. Therefore, when the circuit portion is configured by the MOS circuit such as a CMOS, it is advantage that the parasitic transistor is not provided without the buried diffused layer.

Furthermore, in the present disclosure, the multiple electrical wirings and the multiple back flow prevention elements are arranged around the diaphragm at predetermined intervals.

Therefore, by increasing the number of the electrical wirings and the number, of the MOSFETs, which are the back flow prevention element, it is possible to reduce a potential drop, and thickness dispersion of the diaphragm may be improved.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor physical quantity sensor comprising:
   a semiconductor substrate having a first conductive type;
   a diaphragm portion disposed in the semiconductor substrate;
   a sensing portion disposed in the diaphragm portion;
   a well layer having a second conductive type disposed in a surface portion of the semiconductor substrate, the well layer corresponding to the diaphragm portion; and
   a back flow prevention element corresponding to a MOSFET, the back flow prevention element including
   two $n^+$-type diffused portions spaced apart from each other, positioned to a surface portion of the semiconductor substrate, and disposed on an outside of the well layer in the semiconductor substrate,
   a channel region is provided between the two $n^+$-type diffused portions, and
   a gate electrode disposed on the channel region through a gate insulating film;
   a first $n^+$-type diffused portion of the two $n^+$-type diffused portions is electrically connected to the gate electrode through a first electrical wiring, which provides a passage for applying a predetermined voltage to the well layer from an external circuit;
   a second $n^+$-type diffused portion of the two $n^+$-type diffused portions is electrically connected to the well layer through a second electrical wiring, which provides the passage for applying the predetermined voltage to the well layer from the external circuit;
   the predetermined voltage is applied to the well layer through the first electrical wiring, the back flow prevention element, and the second electrical wiring; and
   only the back flow prevention element turns on based on a voltage applied to the gate electrode.

2. The semiconductor physical quantity sensor according to claim 1, wherein:
   the diaphragm portion is provided by a removal of a back surface portion of the semiconductor substrate opposite to the sensing portion in an electrochemical etching;
   the diaphragm portion has a thickness thinner than a predetermined value; and
   the passage applies the predetermined voltage to the well layer from the external circuit in the electrochemical etching.

3. The semiconductor physical quantity sensor according to claim 2, wherein:
   when the predetermined voltage is applied to the first $n^+$-type diffused portion, the gate electrode, and the second $n^+$-type diffused portion of the back flow prevention element, the MOSFET causes current to flow in a forward direction in the electrochemical etching.

4. The semiconductor physical quantity sensor according to claim 2, further comprising:
   a circuit portion electrically connected to the sensing portion, and a back flow prevention circuit that controls current supply to the circuit portion, wherein the back flow prevention circuit is arranged on a third electrical wiring, which connects between the circuit portion and the diaphragm portion.

5. The semiconductor physical quantity sensor according to claim 4, wherein:
the circuit portion includes a MOS circuit.

6. The semiconductor physical quantity sensor according to claim 4, wherein:
the back flow prevention circuit includes a diode, another MOSFET, or a resistor.

7. The semiconductor physical quantity sensor according to claim 2, further comprising:
an input protection circuit disposed between the external circuit and the back flow prevention element on the first electrical wiring.

8. The semiconductor physical quantity sensor according to claim 7, wherein:
the input protection circuit includes:
a protection resistor connected in series to the first electrical wiring; and
a zener diode connected in parallel to the first electrical wiring.

9. The semiconductor physical quantity sensor according to claim 8, wherein:
the zener diode is connected to an opposite side of the back flow prevention element from the protection resistor, and
the input protection circuit further includes
a restriction resistor disposed on an opposite side of the protection resistor from a connection point of the zener diode and the first electrical wiring.

10. The semiconductor physical quantity sensor according to claim 7, wherein:
the input protection circuit includes:
a protection resistor connected in series to the first electrical wiring; and
a plurality of the zener diodes connected in parallel to each other.

11. The semiconductor physical quantity sensor according to claim 7, wherein:
the input protection circuit includes:
a protection resistor connected in series to the first electrical wiring; and
another MOSFET connected in parallel to the first electrical wiring.

12. The semiconductor physical quantity sensor according to claim 2, further comprising:
another back flow prevention element arranged on another first electrical wiring, wherein
the back flow prevention element and the another back flow prevention element are separately arranged around the diaphragm portion.

13. The semiconductor physical quantity sensor according to claim 1, wherein
the gate electrode is electrically connected to only the first $n^+$-type diffused portion and an electrode.

14. A manufacturing method of a semiconductor physical quantity sensor, the manufacturing method comprising:
preparing a semiconductor substrate having a first conductive type;
forming a plurality of chips having a sensing portion in the semiconductor substrate;
forming a conductive pattern, which is arranged on the semiconductor substrate and connected to a pad, in each chip;
forming a diaphragm portion in each chip of the semiconductor substrate, and
dividing the semiconductor substrate into the plurality of chips after forming the diaphragm portion so that the plurality of chips are separated from each other, wherein:
the forming of the plurality of chips includes:
forming a well layer having a second conductive type in a surface portion of the semiconductor substrate in each chip, the well layer corresponding to the diaphragm portion, and
forming a back flow prevention element on a first electrical wiring, which connects to the conductive pattern and provides a passage for applying a predetermined voltage to the well layer from the pad, in each chip, the back flow prevention element corresponding to a MOSFET and including
two $n^+$-type diffused portions that are formed on an outside of the well layer in the semiconductor substrate, positioned to a surface portion of the semiconductor substrate, and spaced apart from each other,
a channel region provided between the two n+-type diffused portions,
a gate electrode disposed on the channel region through a gate insulating film,
a first $n^+$-type diffused portion of the two $n^+$-type diffused portions electrically connected to the gate electrode through the first electrical wiring, and
a second $n^+$-type diffused portion of the two $n^+$-type diffused portions electrically connected to the well layer through a second electrical wiring, which provides a passage for applying the predetermined voltage to the well layer from the pad, the predetermined voltage being applied to the well layer through the first electrical wiring, the back flow prevention element, and the second electrical wiring;
the forming of the diaphragm portion includes:
soaking the semiconductor substrate into an etching solution;
applying the predetermined voltage to the well layer and the gate electrode via the pad and the conductive pattern in each chip; and
removing a back surface of the semiconductor substrate corresponding to the sensing portion in each chip by an electrochemical etching.

* * * * *